United States Patent
Bortesi et al.

(10) Patent No.: US 7,352,192 B2
(45) Date of Patent: Apr. 1, 2008

(54) METHOD AND RELATIVE TEST STRUCTURE FOR MEASURING THE COUPLING CAPACITANCE BETWEEN TWO INTERCONNECT LINES

(75) Inventors: Luca Bortesi, Besana in Brianza (IT); Loris Vendrame, Carbonera (IT); Alessandro Bogliolo, Urbino (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 65 days.

(21) Appl. No.: 10/836,827

(22) Filed: Apr. 30, 2004

(65) Prior Publication Data

US 2004/0227527 A1   Nov. 18, 2004

(30) Foreign Application Priority Data

May 2, 2003   (EP)   ................................. 03425282

(51) Int. Cl.
*G01R 27/26*   (2006.01)
(52) U.S. Cl. ...................................... 324/658
(58) Field of Classification Search ................ 324/765, 324/658, 676–678, 158.1; 703/14, 2, 14.2
See application file for complete search history.

(56) References Cited

U.S. PATENT DOCUMENTS

| | | | |
|---|---|---|---|
| 5,095,750 A * | 3/1992 | Suzuki et al. ............. | 73/514.19 |
| 5,641,911 A * | 6/1997 | Ryhanen ...................... | 73/718 |
| 6,366,098 B1 | 4/2002 | Froment ...................... | 324/678 |
| 6,856,143 B2 * | 2/2005 | McNutt et al. ............. | 324/658 |
| 6,934,669 B1 * | 8/2005 | Suaya et al. .................. | 703/14 |
| 2002/0116696 A1 | 8/2002 | Suaya et al. .................... | 716/6 |
| 2005/0024077 A1 * | 2/2005 | Huang et al. ............... | 324/765 |

OTHER PUBLICATIONS

Kühn et al., "Interconnect Capacitances, Crosstalk, and Signal Delay in Vertically Integrated Circuits", Siemens AG, Institute for Integrated Circuits & Fraunhofer Institute for Solid State Technology, München, Germany, © 1995 IEEE, pp. 10.3.1 to 10.3.4, month unavailable.

* cited by examiner

*Primary Examiner*—Ha Tran Nguyen
*Assistant Examiner*—Tung X. Nguyen
(74) *Attorney, Agent, or Firm*—Allen, Dyer, Doppelt, Milbrath & Gilchrist, P.A.

(57) ABSTRACT

A method and a relative test structure for measuring the coupling capacitance between two interconnect lines exploits the so-called cross-talk effect and keeps an interconnect line at a constant reference voltage. This approach addresses the problem of short-circuit currents that affect known test structures, and allows a direct measurement of the coupling capacitance between the two interconnect lines. Capacitance measurements may also be used for determining points of interruption of interconnect lines. When a line is interrupted, the measured coupling capacitance is the capacitance of a single conducting branch. The position of points of interruption of an interconnect line is determined by measuring the coupling capacitance of all segments of the line with a second conducting line.

6 Claims, 7 Drawing Sheets

METHOD AND RELATIVE TEST STRUCTURE FOR MEASURING THE COUPLING CAPACITANCE BETWEEN TWO INTERCONNECT LINES

FIELD OF THE INVENTION

The present invention relates to measurement of capacitances, and, in particular, to a method and test structure for measuring coupling capacitances between interconnect lines, especially of an integrated circuit.

BACKGROUND OF THE INVENTION

Integrated circuits are realized on a semiconductor substrate by disposing stacked layers of conducting patterns for interconnecting transistors and other circuit components. As the scale of integration increases, distances of separation both in the vertical and horizontal directions among interconnect lines become increasingly small. These technological advances in the fabrication technologies lead to a net increase of coupling capacitances between neighboring conducting lines belonging to metal levels or even to the same metal. These capacitances cannot be neglected in designing integrated circuits because of the influence they have on the operation of the circuits also in consideration of the ever increasing clock frequencies of electronic circuits.

Therefore, it is necessary to measure the coupling capacitances among neighboring lines such as between adjacent parallel lines or superimposed or even intersecting. Moreover, measuring these capacitances may provide a measure of the thickness of a dielectric layer that may be interposed between superimposed lines.

Capacitance measurement is useful also in DNA analysis. The paper by A. Bogliolo et al. "A Biosensor for Direct Detection of DNA Sequences Based on Capacitance Measurements", *Proc. of the 32$^{th}$ European Solid-State Device Research Conference*, pp. 479-482, 24-26 Sep. 2002, showed that hybridization of self assembled monolayers (SAMs) of oligonucleotides probes of a DNA sensor causes a capacitance variation of the sensor. Therefore, hybridization of DNA probes may be detected by monitoring the capacitance variation of the sensor.

The so-called charge-based capacitive measurement (CBCM) technique is gaining importance for on chip interconnect capacitance measurements because of its accuracy and simplicity as discussed in D. Sylvester et al., "Investigation of Interconnect Capacitance Characterization Using Charge-Based Capacitive Measurement (CBCM) Technique and Three-Dimensional Simulation", *IEEE J. of Solid-State Circuits*, Vol. 33, No. 3, 1998, pp. 449-453. Test structures based on this technique are disclosed in the U.S. Pat. No. 5,999,010 to the assignee Simplex Solution Inc. and in the French Patent Application No. 98-07788 (corresponding to U.S. Pat. No. 6,366,098) in the name of STMicroelectronics S.A. Moreover, the paper by A. Bogliolo et al. "Charge-based on chip measurement technique for the selective extraction of cross-coupling capacitances", *Proc. of 6th IEEE Workshop on Signal Propagation on Interconnects*, pp. 75-77, 12-15 May 2002, discloses a simple test structure implementing a CBCM technique that allows a selective extraction of a cross-coupling capacitance between arbitrary on-chip interconnect lines.

A drawback of the circuits disclosed in the above mentioned documents is that they measure the total parasitic capacitance of an interconnect line, such that the coupling capacitance between two metal lines must be necessarily assessed by repeating the tests under different conditions for calculating the parasitic capacitances between the considered lines and ground. Moreover, the known circuits use at least two switched transistors connected between a node at the supply voltage and the virtual ground node of the circuit. Therefore, to prevent large short-circuit currents, they must be driven by non overlapping PWM signals.

SUMMARY OF THE INVENTION

It is an object of the present invention to provide a method and a relative circuit for measuring the coupling capacitance between two interconnect lines, that does not suffer from the inefficiencies and criticalities of the known circuits.

Generally, the invention exploits the so-called cross-talk effect while keeping an interconnect line at a constant reference voltage. This approach overcomes the problem of possible large short-circuit currents, which are effectively prevented from occurring even if the PWM driving signals of the test switches overlap, and allows a direct measurement of the coupling capacitance between two interconnect lines.

More precisely, the method of the invention is for measuring the coupling capacitance between two interconnect lines, and includes applying a constant reference voltage to one of the two interconnect lines circuit and a PWM voltage to the other line; detecting at least a current pulse on the first line induced by cross-talk between the two lines in coincidence with either the leading or the trailing edge of the PWM voltage; and generating a signal representative of the coupling capacitance as a function of the electric charge flowing in the first line during the current pulse. The method is implemented by a test structure for measuring the coupling capacitance between two interconnect lines as will be described below.

Capacitance measurements according to the method of this invention may also be used for locating an interruption along an interconnect line. In fact, when a line is interrupted, the measured coupling capacitance is the capacitance of the conducting segment that is connected to the test structure. By assuming that the coupling capacitance is proportional to the length of the line, it is possible to assess the length of each segment and thus determine the position of the points of interruption along an interconnect line by measuring the coupling capacitance of the distinct segments of the line with a neighboring conducting line.

Therefore, in accordance with another aspect of the invention, a method of locating a point of interruption along an interconnect line includes forming a second conducting line in proximity of the interrupted interconnect line to be tested; measuring the coupling capacitance of each segment with the second conducting line; and calculating the distance of an interruption point from one end of the interrupted line, by multiplying the total length of the interrupted line by the ratio between the sum of the coupling capacitances of the segments of the line comprised between the end and the interruption point to be located, and the sum of the coupling capacitances of all the segments of the line.

BRIEF DESCRIPTION OF THE DRAWINGS

The different aspects and advantages of this invention will become even more evident through a detailed description referring to the attached drawings, wherein.

DETAILED DESCRIPTION OF THE PREFERRED EMBODIMENTS

Figure 1:
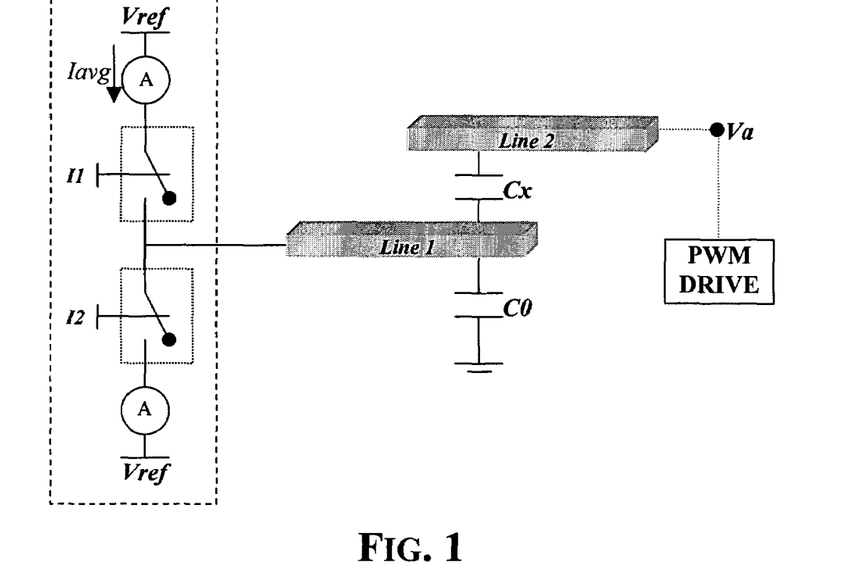
FIG. 1 is a schematic diagram of the test circuit of the invention for measuring coupling capacitances.

The basic arrangement of a coupling capacitance test structure of this invention is depicted in FIG. 1. A good arrangement includes circuit means (depicted within the dash line perimeter) for applying a fixed reference voltage Vref to a first line LINE1, a PWM driving circuit PWM_DRIVE for applying a PWM voltage to a second line LINE2, and sensing means of the current pulses that are induced on LINE1 that are generally indicated as current meters A. The coupling capacitance to be measured is Cx, while C0 is the parasitic capacitance of LINE1 toward ground. As will be shown hereinafter, by using the method of this invention the parasitic capacitance toward ground of LINE1 does not influence the measure of Cx.

Figure 2:
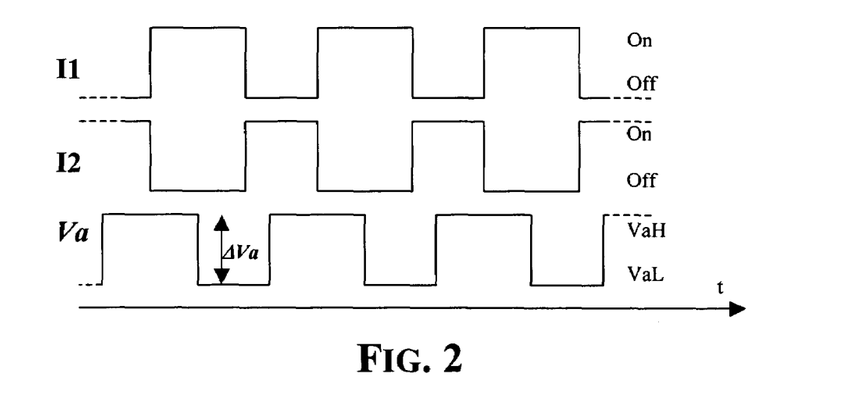
FIG. 2 is a timing diagram of the main signals of the circuit of FIG. 1.

Contrary to the prior art approaches, wherein the first line LINE1 is switching from a reference voltage to ground and vice versa, thus making the measurement of the parasitic capacitance C0 mandatory for determining the coupling capacitance Cx, because of the flowing of a current through it, according to this invention, the first line LINE1 is constantly kept at a reference voltage Vref while a PWM voltage is applied to the second line LINE2, as shown in the time diagram of FIG. 2. Therefore, the parasitic capacitance C0 remains at a constant voltage Vref and does not interfere with the measurement of the coupling capacitance Cx.

When the PWM voltage Va switches, a current pulse is induced on the first line LINE1 at every transition because of the cross-talk effect. Obviously, the leading edges of Va induce on LINE1 current pulses of a certain sign and the trailing edges thereof induce current pulses of opposite sign. Qx being the electric charge of a certain sign flowing in the interconnect line LINE1 in coincidence of leading edges of the PWM voltage Va, and $\Delta Va$ being the amplitude of the PWM voltage, then:

$$Qx = Cx * \Delta Va \quad (1)$$

By measuring the charge Qx, it is possible to calculate the coupling capacitance Cx.

According to a preferred embodiment of the method of this invention, the capacitance Cx is calculated as a function of a time average of current pulses of a same sign induced on LINE1. With Freq the frequency of the PWM voltage, the time average current Iavg of the current pulses of the same sign on LINE1 is $$Iavg = Qx * Freq = Cx * \Delta Va * Freq \quad (2)$$

Therefore, the coupling capacitance may be measured by measuring the current Iavg and applying the following formula $$Cx = Iavg/(\Delta Va * Freq) \quad (3)$$

The test structure of the invention depicted in FIG. 1 provides a measure of the capacitance Cx by the use of this formula (3).

Differently from the known arrangements, the pair of switches connect the first line LINE1 to the same reference voltage Vref. The function of these switches is not to switch LINE1 between two different voltages, but solely to direct the current pulses induced on LINE1 during the switching transients of the PWM voltage Va toward the upper or the lower current meter A, depending on the sign of the current pulse. These current meters A provide signals representative of the time average of current pulses of the same sign (Iavg), which is proportional to the coupling capacitance Cx.

The only requisite of the control phases of the switches I1 and I2 is that the appropriate configuration of the two switches be already established before the next transition of the PWM voltage Va occurs. This is a remarkable advantage because, differently from the test structure of the above mentioned prior art documents, the control signals of the switches I1 and I2 may even overlap without causing a short-circuit current. Moreover, the absence of transients on the first interconnect line LINE1 allows the test structure of FIG. 1 to work at relatively high frequencies for improving the precision of the capacitance measurement.

Figure 3A:
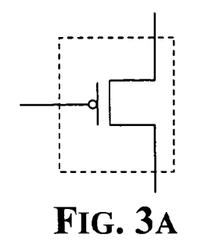
FIGS. 3a to 3c are diagrams depicting different CMOS controlled switches usable in the test circuit of FIG. 1.
Figure 3B:
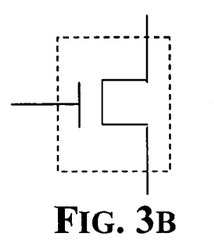
Figure 3C:
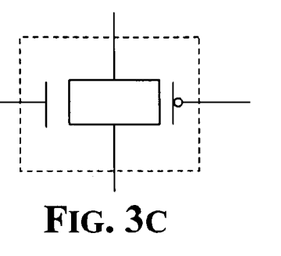

Preferably, the switches I1 and I2 are realized in CMOS technology with a PMOS or a NMOS transistor, or alternatively as a CMOS pass-gate controlled by complementary control signals, as shown in FIGS. 3a, 3b and 3c. As an alternative, in on board applications these switches may be formed by relays.

Figure 4:
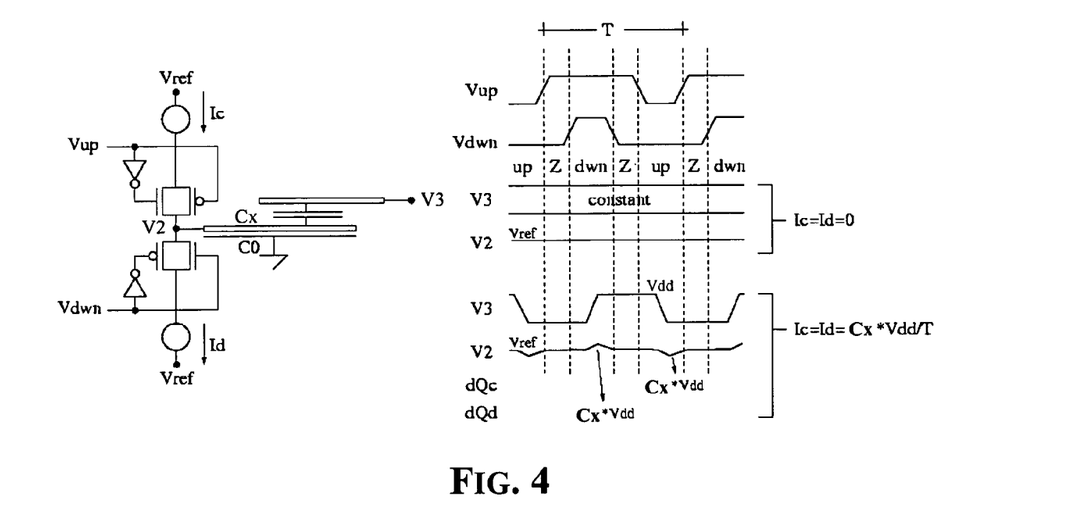
FIG. 4 is a schematic diagram illustrating a preferred embodiment of the test structure of the invention realized with CMOS pass-gates and the relative timing diagram of the main signals.
Figure 5:
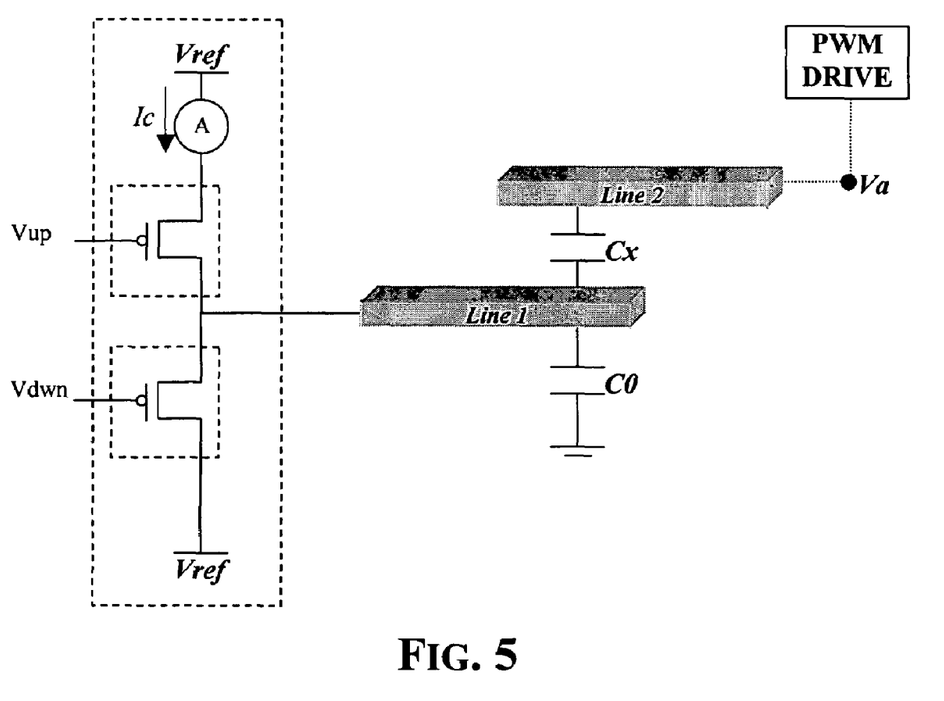
FIG. 5 is a schematic diagram illustrating an alternative embodiment of the test structure of the invention realized with PMOS transistors.

Embodiments of the test structure of this invention using pass-gates or PMOS transistors are depicted in FIGS. 4 and 5. The timing diagram of FIG. 4 illustrates the operation of the structure when the second line is at a constant voltage V3 and when it is PWM driven. In this last case the induced negative (dQc) and positive (dQd) electric charges are evaluated by the time average of the respective current pulses measured by the two current meters.

The embodiment of FIG. 4 is preferred because the measurement of the coupling capacitance Cx is less affected by errors due to channel charge distributions in the switches. Moreover, by choosing the mean voltage between the high and the low levels of the control voltages Vup and Vdwn as a reference voltage Vref, the structure is perfectly symmetrical. Of course, there may be errors due to other effects such as that of the switching noise of the control phases, but these errors are systematic and may be readily eliminated by carrying out differential measurements. In practice, the average currents Ic and Id are measured during a first test with a constant voltage V3 and during a second test with a PWM voltage V3. The two results are then compared to eliminate systematic errors. This is another advantage of the test structure of this invention, because it is not necessary to duplicate it for carrying out differential measurements, as it is required with the test structures of the above discussed prior art documents.

Figure 6:
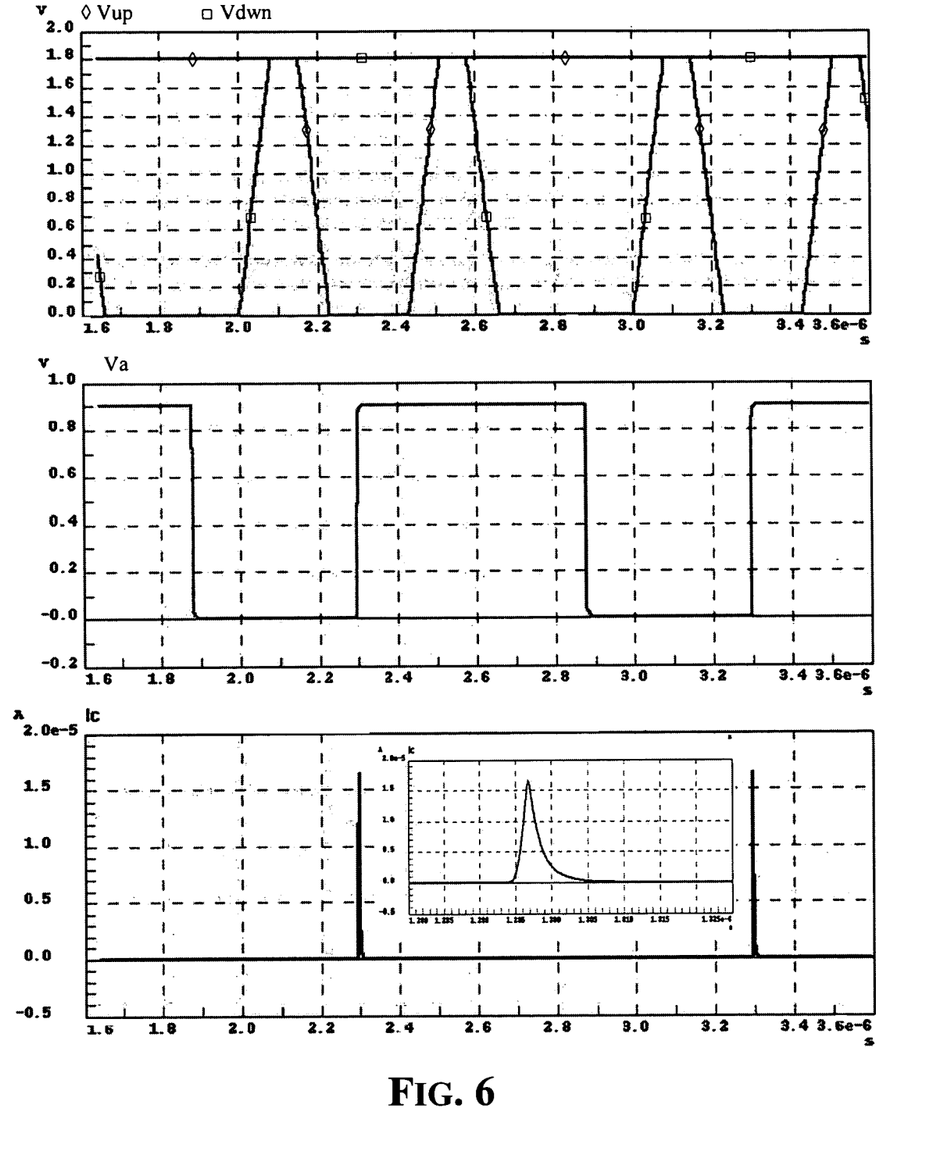
FIG. 6 is a timing diagram of the main signals of the circuit of FIG. 5.

FIG. 6 shows timing diagrams of the main signals of the test structure of FIG. 5 obtained with the electronic circuit simulator SPICE, using the following parameters:

$V$up, $V$dwn: 0 1.8 V $V$ref=Δ$Va$=0.9 V

C0=10 $fF$;

Freq=1 MHz;

Cx=51 $fF$.

FIG. 6 depicts also an enlarged view of a current pulse induced on LINE1.

Figure 7A:
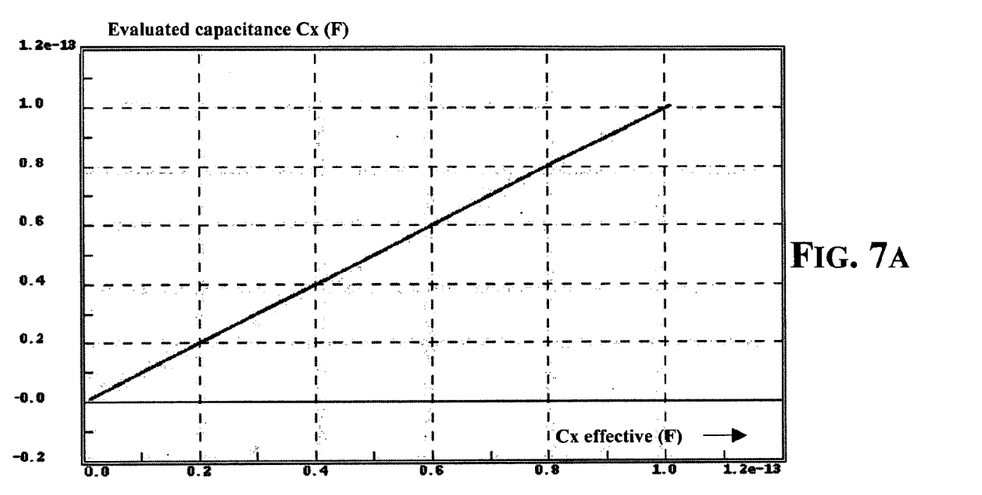
FIG. 7a is a graph of the comparison between the evaluated coupling capacitance Cx and its effective value for the embodiment of FIG. 5.
Figure 7B:
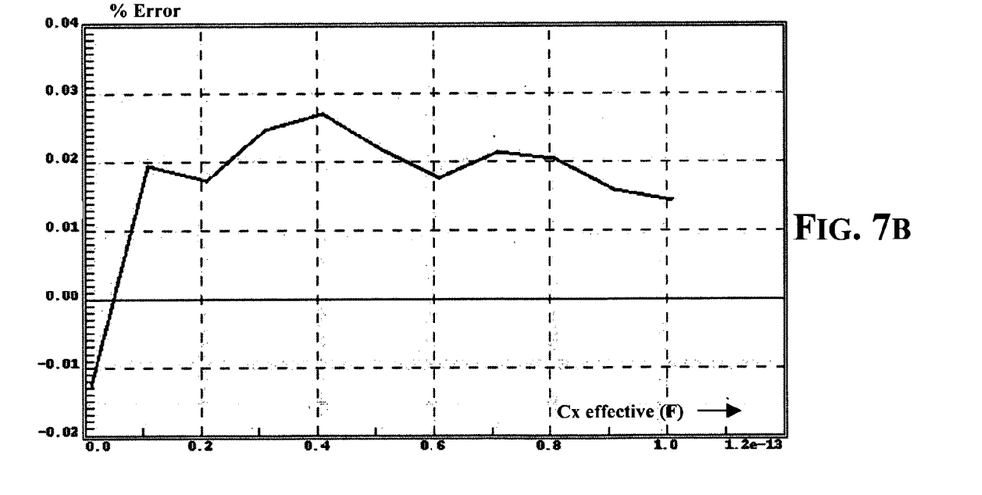
FIG. 7b is a graph of the percentage difference between the evaluated and effective capacitance Cx as a function of the effective capacitance Cx.

Simulations for different values of the coupling capacitance Cx ranging from 1 fF to 101 fF have been performed. The coupling capacitance has been evaluated using eq. (3) and the results are compared in FIGS. 7a and 7b with the effective (real) capacitance Cx. As may be noticed, the percentage difference between the evaluated capacitance and its effective value is smaller than 0.03%.

The test structure of this invention may even be used in capacitive accelerometers. The sensing element of these accelerometers is substantially a capacitor having a fixed plate, while the other plate is at a distance which varies as a function of the acceleration. By measuring the capacitance between the two plates, it is possible to calculate the acceleration sensed by the accelerometer.

Figure 8:
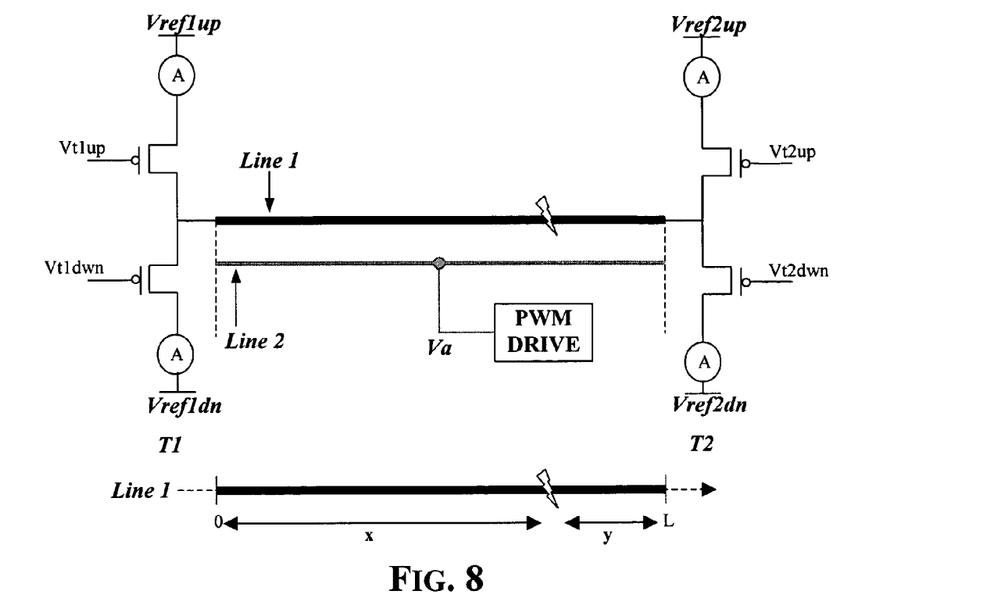
FIG. 8 is a schematic diagram illustrating a test circuit according to another embodiment of the invention.

According to another aspect of this invention, it has been found that by measuring the coupling capacitance between two interconnect lines the precise location point of interruption of a line may be obtained. FIG. 8 shows the test arrangement for locating the position of a point of interruption between two adjacent segments "x" and "y" of a circuit line LINE1, the coupling capacitance of each segment with the second LINE2 is proportional to its length. Therefore, by measuring the coupling capacitance CT1 of the segment "x" and CT2 of the segment "y" with the same LINE2 according to the method of this invention, and by knowing the total length L of LINE1, the position of the interruption from an extremity of the line will be given by the following equation:

$$x=L*CT1/(CT1+CT2) \quad (4)$$

This technique of location of points of interruption may be applied to the interrupted line having any number of segments. CT1, ..., CTn being the coupling capacitances of the "n" isolated segments of a broken line LINE1 with a second line LINE2 running along the whole length of LINE1, the distance of the m-th interruption point from a first extremity of LINE1 will be given by the following equation:

$$x=L*(CT1+\ldots+CTm)/(CT1+\ldots+CTn) \quad (5)$$

This method of finding the positions of interruption points of an interconnect line using the test structure of this invention is useful even for printed circuit boards and chips where Time Domain Reflectometry (see L. P. Van Biesen, J. Renneboog and A. R. F. Barel. "High Accuracy Location of Faults on Electrical Lines Using Digital Signal Processing," *IEEE Trans. Instr. Meas.*, vol. 39 No. 1, pp. 175-179, February 1990; and J.-M. Jong and V. K. Tripathi. "Time-Domain Characterization of Interconnect Discontinuities in High-Speed Circuits," *IEEE Trans. Instr. Meas.*, vol. 15 No. 4, pp. 497-504, August 1992.) cannot be used because of an excessive shortness of interconnect lines. Moreover, it may be implemented in Built-In Self-Test (BIST) structures of integrated circuits.

A test circuit of the integrity of an interconnect line LINE1 may be as depicted in FIG. 8. According to this preferred embodiment the test circuit includes two pairs of identical controlled branches for connecting one end and the opposite end, respectively of the line LINE1 to certain reference voltage nodes, alternately through an upper path and a lower path. Each path includes a controlled switch and a current meter A; means for alternatively coupling the voltage reference nodes alternatively to a constant reference voltage Vref, to the supply voltage Vdd, to ground GND or letting them float; a PWM driving circuit for applying a PWM voltage Va to a second neighboring line of the line LINE1; and a control circuit (not depicted) for generating the control signals for switching the connecting branches and for changing the voltage of the voltage reference nodes.

Figure 9A:
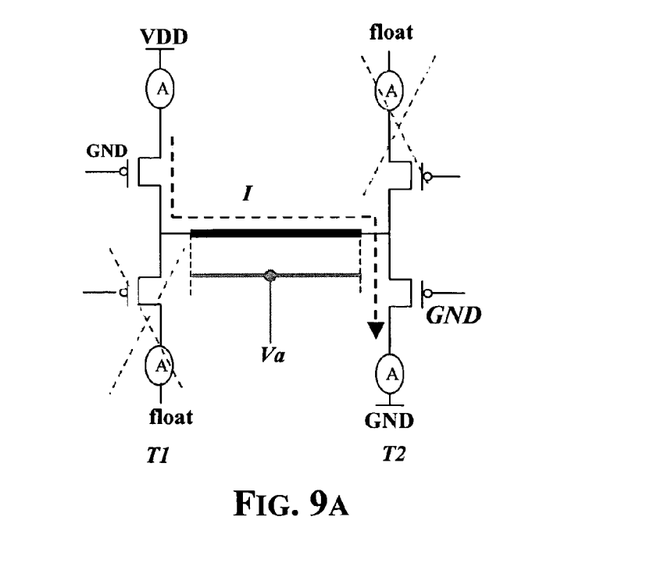
FIGS. 9a and 9b are schematic diagrams illustrating how to test the integrity of an interconnect line and how to measure a coupling capacitance with the test circuit FIG. 8.
Figure 9B:
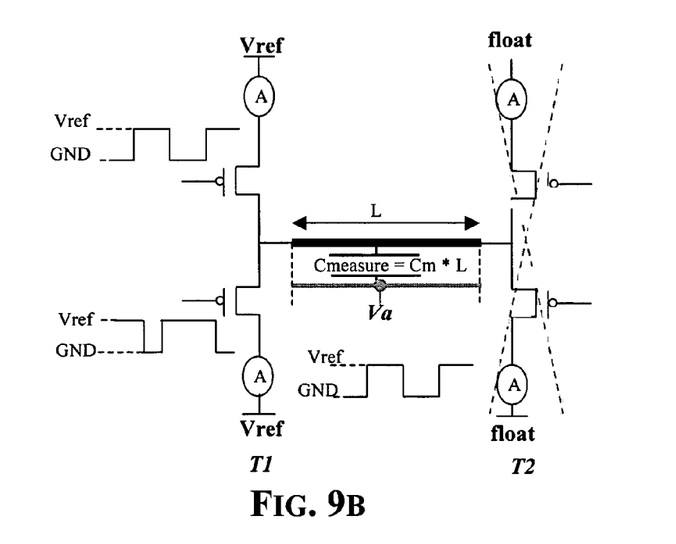

First, the integrity of the line LINE1 is tested by causing a voltage drop on the line. This may be easily done by appropriately choosing the voltages to be applied to the reference voltage nodes as depicted in FIG. 9a. If the line is not interrupted, it is possible to measure its coupling capacitance with another neighboring line as depicted in FIG. 9b, by keeping floating the pair of connecting branches at one end while connecting the other pair to a certain reference voltage Vref and applying the PWM voltage Va to the neighboring line. In case of the existence of an interruption along the line LINE1, the measurement, according to the test arrangement of FIG. 9b, produces the value of coupling capacitance CT1 of a first segment. The coupling capacitance of the other segment is obtained by repeating the measurement according to the test arrangement of FIG. 9b, after having exchanged the roles of the two pairs of connecting branches at the opposite ends of this line LINE1.

Figure 10:
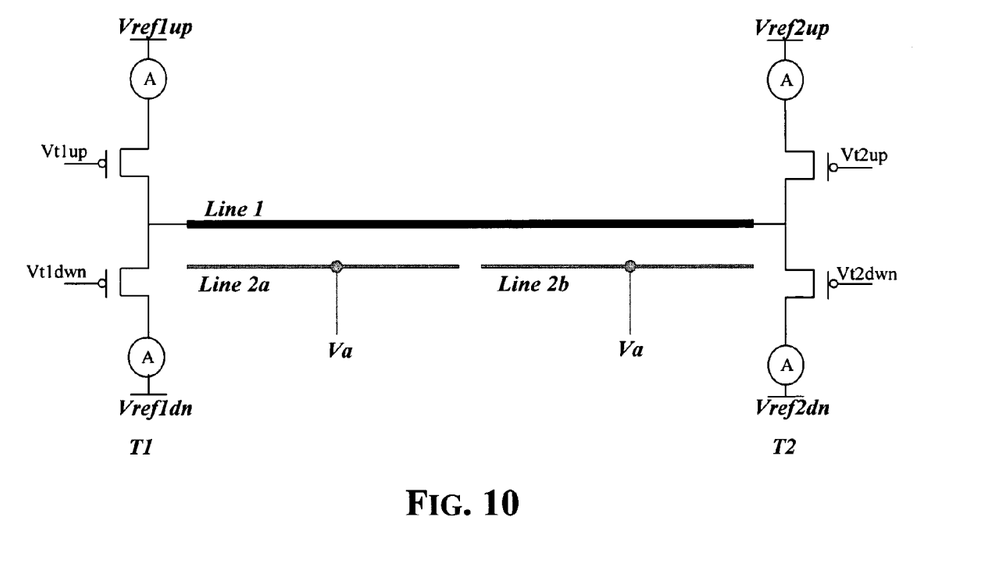
FIG. 10 is a schematic diagram illustrating another embodiment of a test circuit of the invention.

It is also possible to use a neighboring line divided in two segments of known length, to both of which the PWM voltage Va, as depicted in FIG. 10, and to measure the coupling capacitances of LINE1 with both LINE2a and LINE2b. This alternative test arrangement allows the determination of the position of eventual interruption points with enhanced spatial resolution.

A further application of the method of measuring a coupling capacitance of this invention is in the field of DNA analysis. As already mentioned, it is possible to detect the hybridization of DNA probes of a DNA sensor, composed of a metal electrode on a surface of which the probes are immobilized, by carrying out a capacitance measurement. This measurement may be conveniently performed by disposing a second metal electrode in proximity of the first electrode and measuring the coupling capacitance between the two electrodes with the method of the invention.

That which is claimed is:

1. A method of measuring the coupling capacitance between first and second conductive lines of an integrated circuit comprising:

applying a constant reference voltage to the first line of the integrated circuit and a pulse width modulation (PWM) voltage to the second line of the integrated circuit;

detecting at least a current pulse induced on the first line of the integrated circuit coinciding with one of a leading and a trailing edge of the PWM voltage; and generating a signal representative of the capacitance as a function of the charge flowing in the first line of the integrated circuit corresponding to the current pulse.

2. The method of claim 1, wherein detecting comprises detecting a plurality of current pulses on the first line of the integrated circuit; and wherein generating comprises generating the representative signal as a function of a time average of current pulses of a same sign detected on the first line of the integrated circuit.

3. The method of claim 2, wherein the representative signal is generated by scaling the time average of current pulses of the same sign by a product of a switching frequency and an amplitude of the PWM voltage.

4. A method of measuring the capacitance between first and second stationary conductive lines comprising:

biasing the first line at a fixed constant reference voltage while applying a pulse width modulation (PWM) voltage to the second line;

detecting a current pulse induced on the biased first line coinciding with one of a leading and a trailing edge of the PQM voltage; and generating a signal representative of the capacitance based upon the current pulse detected in the first line.

5. The method of claim 4, wherein detecting comprises detecting a plurality of current pulses on the first line; and wherein generating comprises generating the representative signal based upon a time average of current pulses of a same sign detected on the first line.

6. The method of claim 5, wherein the representative signal is generated by scaling the time average of current pulses of the same sign based upon a switching frequency and an amplitude of the PWM voltage.

* * * * *

UNITED STATES PATENT AND TRADEMARK OFFICE
CERTIFICATE OF CORRECTION

PATENT NO. : 7,352,192 B2
APPLICATION NO. : 10/836827
DATED : April 1, 2008
INVENTOR(S) : Luca Bortesi, Loris Vendrame and Alessandro Bogliolo It is certified that error appears in the above-identified patent and that said Letters Patent is hereby corrected as shown below:

Column 4, Line 35    Delete: "11"
                     Insert: --I1--

Column 4, Line 35    Delete: "12"
                     Insert: --I2--

Column 8, Line 3     Delete: "PQM"
                     Insert: --PWM--

Signed and Sealed this

Fourteenth Day of October, 2008

JON W. DUDAS
*Director of the United States Patent and Trademark Office*